United States Patent
Gouravaram et al.

[11] Patent Number: 5,872,449
[45] Date of Patent: Feb. 16, 1999

[54] SEMICONDUCTOR PACKAGE QUALIFICATION CHIP

[75] Inventors: Sudhakar Gouravaram, Fremont; Wei-Mun Chu; Huy Tran, both of San Jose, all of Calif.

[73] Assignee: LSI Logic Corporation, Milpitas, Calif.

[21] Appl. No.: 878,089

[22] Filed: Jun. 18, 1997

Related U.S. Application Data

[63] Continuation of Ser. No. 592,802, Jan. 26, 1996, abandoned.

[51] Int. Cl.$^6$ .................................................. G01R 35/00
[52] U.S. Cl. .......................................................... 324/158.1
[58] Field of Search ................................ 324/158.1, 765, 324/763, 74

[56] References Cited

U.S. PATENT DOCUMENTS

| | | | |
|---|---|---|---|
| 4,243,937 | 1/1981 | Multani et al. ........................... | 324/158 |
| 4,684,884 | 8/1987 | Soderlund .................................. | 324/73 |
| 4,933,635 | 6/1990 | Deutsch et al. .......................... | 324/158 |
| 5,068,547 | 11/1991 | Gascoyne ................................. | 307/443 |
| 5,088,190 | 2/1992 | Malhi et al. .............................. | 29/843 |
| 5,262,719 | 11/1993 | Magdo ...................................... | 324/158 |
| 5,289,113 | 2/1994 | Meaney et al. .......................... | 324/73.1 |
| 5,414,351 | 5/1995 | Hsu et al. ................................. | 324/756 |
| 5,468,541 | 11/1995 | Hsu ......................................... | 428/210 |
| 5,477,160 | 12/1995 | Love ........................................ | 324/755 |
| 5,570,035 | 10/1996 | Dukes et al. ............................. | 324/763 |

*Primary Examiner*—Ernest F. Karlsen

[57] ABSTRACT

A multi-sided, integrated circuit die includes a plurality of read only memory (ROM) circuits, positioned only at the corners of the die, to simplify qualification testing of new package designs. During qualification testing, electrical and environmental stresses are applied to the package and die combination. The package and die are electronically evaluated at predetermined intervals to determine whether a failure has occurred during testing. When a failure occurs during testing, the package and die are diagnosed to isolate and determine the cause or source of the failure. Package design parameters are adjusted accordingly to reduce or eliminate the occurrence of the failures. An optional 12-bit counter is fabricated onto the die for each ROM circuit to exercise the ROM during qualification testing. An optional process monitor is also fabricated onto the die for each ROM circuit to determine the strength of the fabrication process and the resulting quality of circuit elements produced therefrom.

8 Claims, 3 Drawing Sheets

SEMICONDUCTOR PACKAGE QUALIFICATION CHIP

This is a continuation of application Ser. No. 08/592,802, filed Jan. 26, 1996, now abandoned.

TECHNICAL FIELD

The present invention relates to a method and apparatus for qualification testing of integrated circuit devices. More particularly, it relates to an integrated circuit die for use during package qualification testing of all integrated circuit packages.

BACKGROUND

As a quality control measure, integrated circuit chip manufacturers verify the reliability of integrated circuit package designs by stress testing the package to ensure that it will withstand electrical and environmental conditions normally experienced during operation. During qualification (burn-in) tests, electrical and environmental stresses are applied to the package while periodically observing the ability of the package to withstand the applied stresses and adequately protect the device circuitry. The test package is typically a production package having a production die (a semiconductor substrate with integrated circuitry) assembled in the test package.

Production dice typically employ the most advanced technology and are therefore usually large, complex, and suffer from low production yields. As a result, production dice are expensive, not only to manufacture, but also to use for package qualification testing. When a failure occurs during qualification testing, determining the cause of the failure can be very difficult due to the complexity of the production die. Thus, the use of production dice unnecessary complicates qualification testing of integrated circuit packages.

Therefore, a need exists for an integrated circuit die specifically designed for package qualification testing. The die should be inexpensive to manufacture and use, and it should simplify failure analysis.

SUMMARY

The invention provides an integrated circuit die for use during qualification testing of an integrated circuit package. The die, which is structurally and electrically connected to the package, includes a multi-sided substrate, such as a rectangular or triangular shaped substrate, having a periphery and a plurality of corners formed at the interface where two sides are joined. A plurality of bonding sites are positioned at the periphery of the substrate. Positioned adjacent the corners of the substrate are a plurality of substantially identical integrated circuits. Means are provided for electrically connecting the circuits to the bonding sites, which means include the use of metal traces to electrically connect the circuits to the bonding sites. In one embodiment, the circuits are read only memory circuits.

The integrated circuit die, according to the invention, may further include a plurality of counters. Of the plurality of counters, specific unique counters are electrically connected to each of the identical circuits.

The die may also include a plurality of process monitors. Specific process monitors are electrically connected to each of the identical circuits.

The quality of any package for integrated circuits can be tested with the die of the invention. The die and package combination is termed a test device. The test device includes a multi-sided structural support member, such as a four-sided support member, for packaging an integrated circuit die. An integrated circuit die structurally attached and electrically connected to the structural support member. The die, which includes a multi-sided substrate having a periphery and a plurality of corners, is identical to the preferred die discussed above. The test device includes means for electrically connecting the bonding sites of the die to the structural support member. In one embodiment, bond wires are employed to electrically connect the die and support member.

The invention also provides a method of optimizing the design of an integrated circuit package. The method includes the step of fabricating a plurality of substantially identical integrated circuits adjacent the corners of a multi-sided substrate. The circuits are electrically connected to bonding sites positioned at the periphery of the substrate. The substrate is structurally and electrically connected to the integrated circuit package being tested. The package, substrate, and circuits collectively are a test device. The test device is then tested. Failures that occur to the test device during testing are diagnosed, and package design parameters attributable to these failures are adjusted as necessary to reduce the occurrence of such failures.

To test the device, electrical and environmental stresses are applied to the test device. The test device is then electrically tested on a logic tester at predetermined time intervals to detect failures occurring during a predetermined time interval.

BRIEF DESCRIPTION OF THE DRAWING

The preferred embodiments of the invention will now be described in further detail with reference to the drawings wherein like reference characters designate like or similar elements throughout the several drawings as follows.

DETAILED DESCRIPTION OF THE PREFERRED EMBODIMENTS

Figure 1:
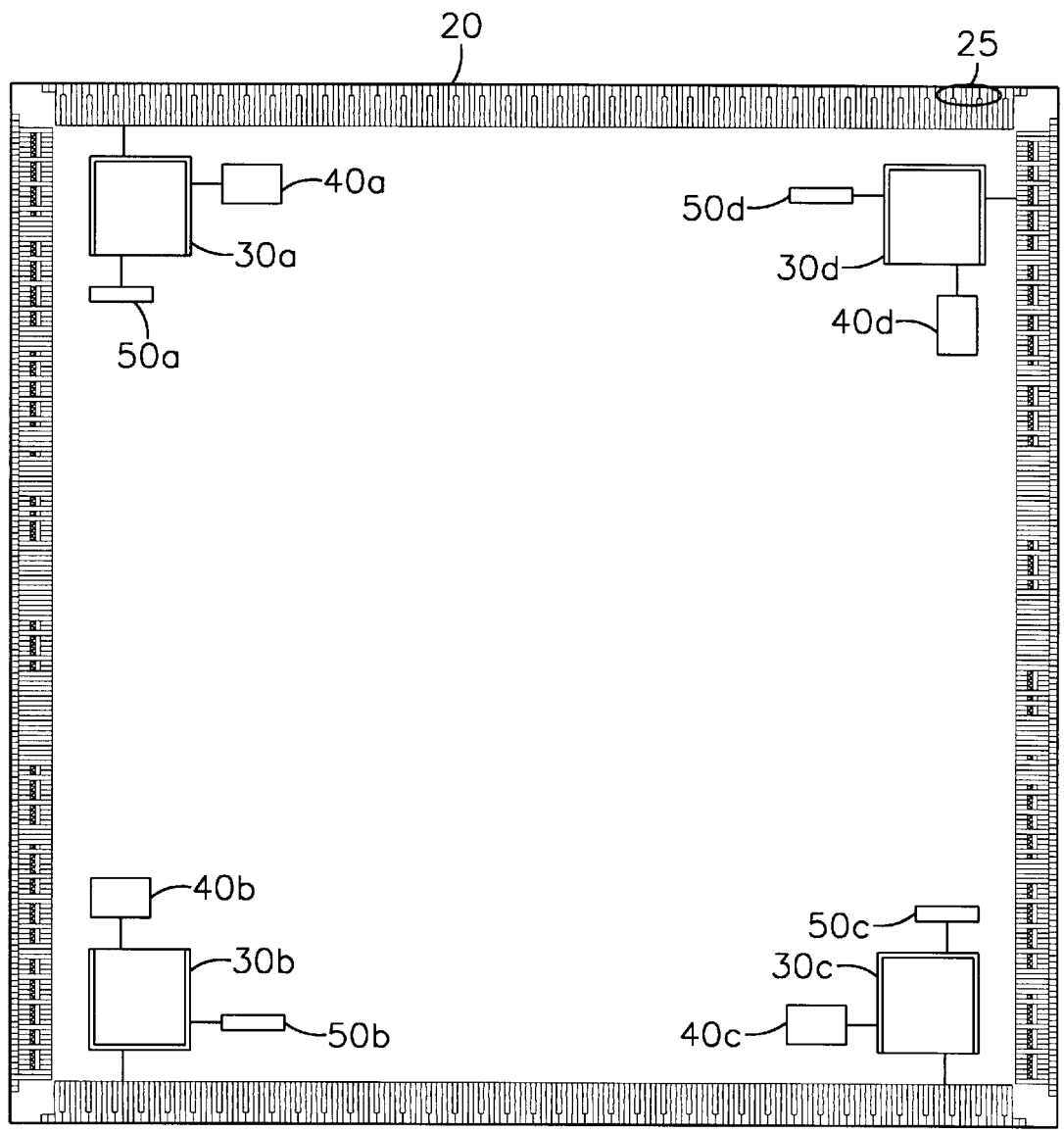
FIG. 1 is a plan view of a four-sided die showing the corner circuitry in block form.

A preferred embodiment of the present invention, as shown in FIG. 1, includes a test die 10 having an integrated circuit substrate 20, such as a silicon substrate, with four integrated circuits 30a–d fabricated onto the substrate 20. Each of the integrated circuits 30a–d is electrically connected by metal traces (not shown) to bonding sites, shown generally at 25, located at the periphery of the die 10. The substrate 20 of FIG. 1 is of rectangular dimension and preferably diced or cut from a silicon wafer. The substrate 20 can be fabricated to any dimension from any integrated circuit material using any integrated circuit substrate fabrication technique.

As FIG. 1 illustrates, the rectangular shaped die 10 is a square shaped die 10 in a preferred embodiment. The die 10 is structurally attached and electrically bonded to a package base 62 (shown in FIG. 2) using known attachment and wirebonding techniques. For a ceramic package base 62, the die 10 is preferably secured to the base 62 with an adhesive material, such as silver glass. The secured die 10 is then preferably wirebonded to the package base 62 using standard wirebonding techniques. For a package base 62 made of plastic, the die 10 is preferably potted to the base 62 after wirebonding is complete. After enclosing the die 10 with a package lid 64, the resulting base 62, lid 64, and die 10 combination, or test device 60, is then ready to be tested.

While a preferred embodiment employs standard wirebonding techniques to electrically connect the die 10 to the package base 62, it will be understood that the die 10 and package base 62 may be electrically connected by employing non-wirebonding techniques, such as "chip-on-tape" and "flip chip" techniques.

Figure 2:
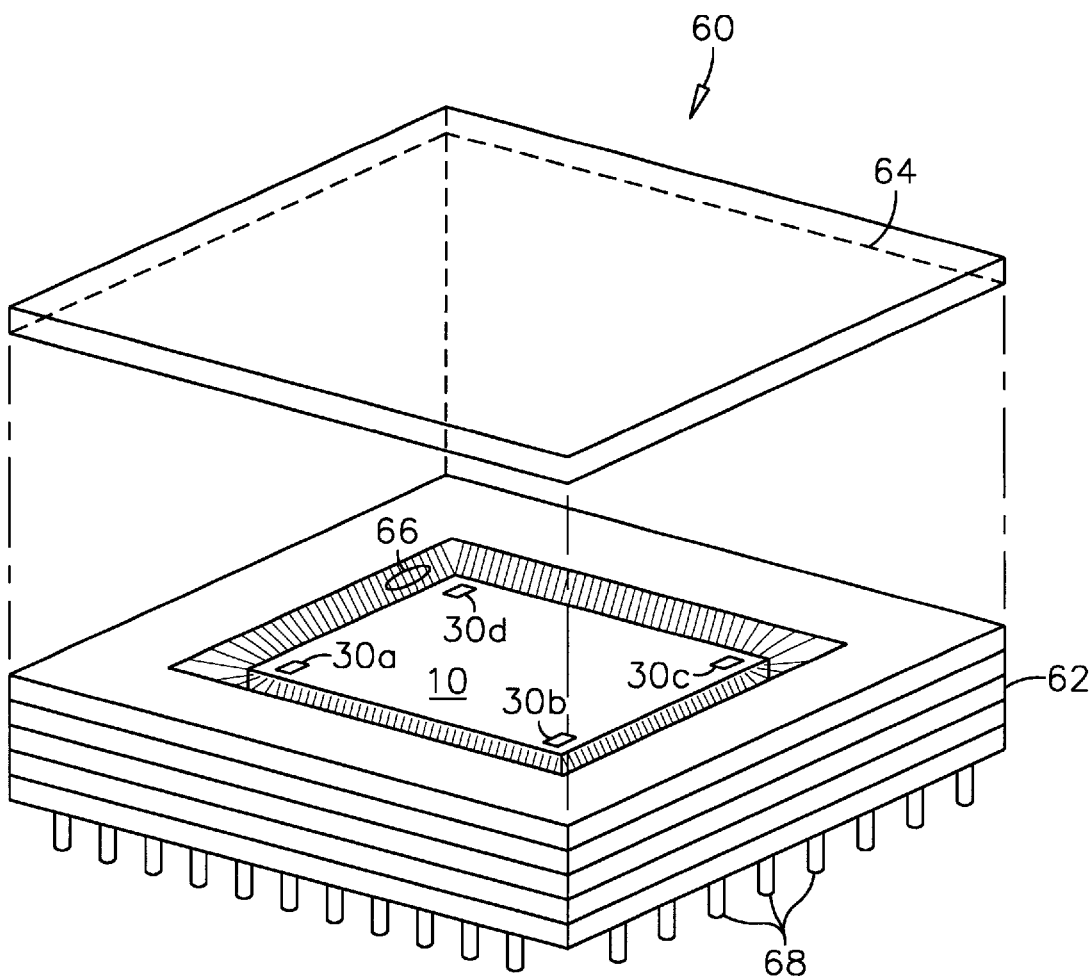
FIG. 2 is an exploded assembly view of a package with the die of FIG. 1 attached thereto.

The rectangular test device 60 of FIG. 2 includes an exemplary package base 62 typically formed from a plurality of laminated layers of plastic or ceramic material that are capped by a lid 64. The base 62 and lid 64 collectively represent the package to be tested. To more closely approximate the response of an actual production device which has a production die attached and bonded to the package base 62, a test die 10 is attached and electrically bonded to the package base 62 using standard techniques. At the periphery of the die 10 are a plurality of bonding sites 25 onto which a plurality of small diameter bond wires, shown generally at 66 in FIG. 2, are attached to provide an electrical bond or connection between the test die 10 and the package base 62, thereby creating electrical conductivity between the die 10 and connector pins 68. The laminated layers of the base 62 provide conductor separation between the die 10 and connector pins 68 projecting from the package bottom by means of metal traces (not shown) that are deposited onto the laminated layers. The metal traces function as electrical conductors to provide electrical continuity between the bond wires 66 and connector pins 68.

As is well known, a primary purpose of the package base 62 and lid 64 combination is to structurally support and protect the relatively fragile die 10. The package base 62 also serves to provide an I/O interface for the die 10 with other electronics.

Figure 3:
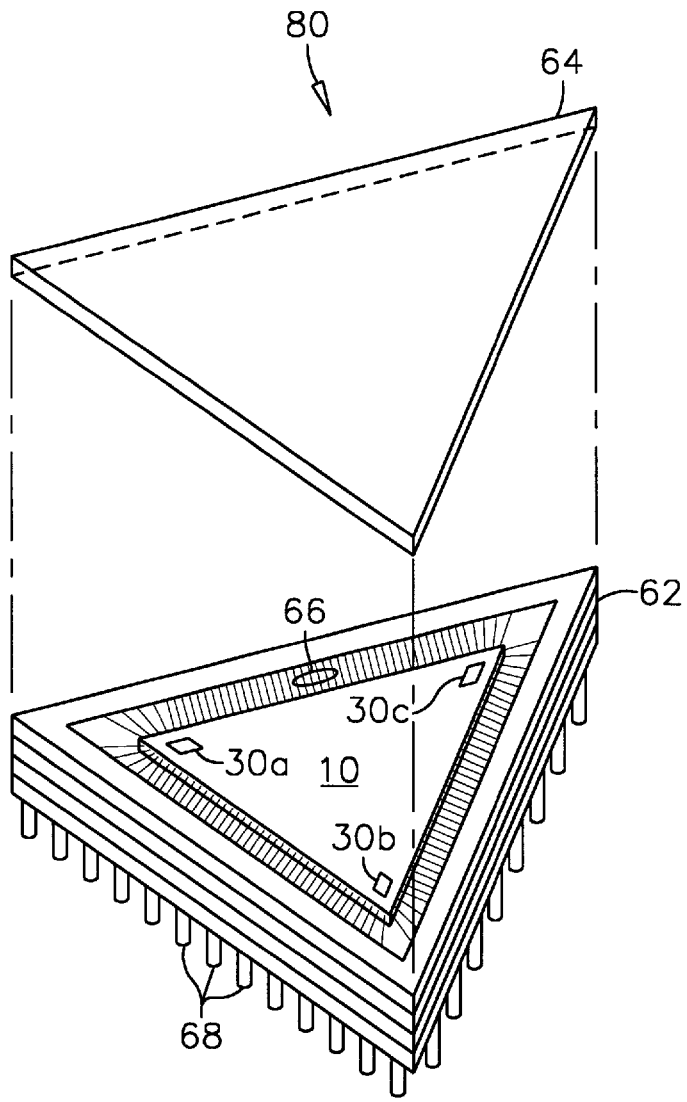
FIG. 3 is an exploded assembly view of a three-sided embodiment of the invention.

Integrated circuit devices come in a variety of shapes and sizes. As FIG. 3 illustrates, the present invention is not limited to orthogonal-shaped devices, but rather, may be applied to any integrated circuit device of any size or dimension. In the three-sided embodiment of a test device 80 shown in FIG. 3, three integrated circuits 30a–c are positioned at the corners of a die 10 which is electrically connected to a package base 62 by bond wires 66. The die 10 is structurally attached to the base 62 in accordance with methods previously described with respect to the rectangular embodiment of FIG. 2. Not shown in FIG. 3 are metal traces electrically connecting the circuits 30a–c to bonding sites on the periphery of the die 10, as discussed previously with regard to FIG. 2.

During qualification stress testing of a proposed semiconductor package design, electrical and environmental stresses are applied to the package to determine its suitability for use. For example, to assess the ability of a ceramic package to withstand high operating voltages and temperatures, the test device 60 is placed in an environmental test chamber where electrical and environmental stresses are applied to the device 60. For a package (base 62 and lid 64) having a 5 volt operating voltage, a typical high temperature operating life test (HTOL) would stress the device by applying 6 volt power and 150 degree centigrade ambient temperature to the test device 60. In an exemplary test, the test device 60 is removed from the test chamber after predetermined periods of testing, such as 48 hrs, 168 hrs, 500 hrs, 1,000 hrs, and 2,000 hrs, and evaluated on a semiconductor logic tester (not shown), such as an STS-256™ logic tester manufactured by Credence Systems, Corp., to determine whether the test device 60 has experienced a failure. According to the invention, these tests are run with a test die 10 assembled in the package so that the tests will more closely approximate the response of the package during normal operation.

When the logic tester indicates that a failure has occurred and the test die 10 within the test device 60 no longer functions properly, a failure analysis is conducted to determine the cause of the failure. Failures are first analyzed and isolated as either a package base failure, such as a shorting of metal traces across layers, or a failure of the test die circuitry 30a–d. Once isolated, the test die 10 or package base 62 may be analyzed to determine the cause of the failure so that appropriate changes to package design parameters can be made to prevent a reoccurrence of the failure in production devices. In other words, changes to package design parameters are effectuated in order to reduce the occurrence of failures caused by package design flaws.

For example, suppose that during high temperature testing circuit 30c failed and analysis of the circuit 30c showed that the failure was caused by high temperature breakdown of circuit components. Suppose further that from this information it is determined that the package base 62 provides an inadequate level of thermal protection for the die 10 because the package base 62 is too thin. From these results, the package base 62 could then be redesigned as necessary to provide an adequate level of thermal protection for production dice. As another example, suppose a package base failure that occurred during high temperature testing is determined to have been caused by a melting of metal traces across laminated layers. Possible corrective actions for this type of failure may include an increase in the thickness of the laminated layers and/or metal traces, or the use of a higher temperature material for the metal traces. The invention, therefore, provides a method for optimizing the design of an integrated circuit package.

The present invention eliminates the expense, complexity, and diagnostic problems associated with use of production dice for qualification testing. This is accomplished by incorporating within the test device 60 a test die 10 having circuitry that greatly simplifies failure analysis and diagnostics during package qualification testing. As FIGS. 1–3 illustrate, integrated circuits 30a–d are positioned at the areas of the die 10 most likely to be affected by electrical and environmental stresses applied to the test device 60 during qualification testing. In FIG. 1, the circuits 30a–d are preferably positioned at the four corners of the integrated circuit substrate 20 because the corners of the device 60 are generally more affected by electrical and environmental stresses than other parts of the device 60. Likewise, the circuits 30a–c shown in FIG. 3 are positioned at the corners where higher stresses are expected. Alternatively, integrated circuits may be fabricated onto any portion of the substrate 20 that is susceptible to failure during testing, such as along the outer edges or periphery of the substrate 20. The remainder of the substrate 20 (where the effects of environmental stresses are not expected to be as dramatic) is preferably kept free of circuitry to improve fabrication yield and reduce the likelihood that a failure will occur in the circuitry 30a–d for reasons unrelated to package stress issues.

To simplify failure diagnostics and analyses when a failure occurs during testing, each of the circuits 30a–d are memory circuits. In a preferred embodiment, each of the circuits 30a–d is a 4K×16 bit, read only memory (ROM) circuit. In an alternate embodiment, circuits 30a–d are 8K×22 bit ROM circuits. Each memory circuit 30a–d has a predefined bit pattern written in during fabrication so that, in order to determine whether a circuit 30*a*–*d* has failed, one need only read the contents of the circuit 30*a*–*d*. Each memory circuit 30*a*–*d* is therefore simple and repetitive, providing a circuit that is relatively easy and inexpensive to fabricate and one which provides excellent diagnostic features.

To exercise and further stress the memory circuits 30*a*–*d* during qualification testing, an optional 12-bit counter 40*a*–*d* (for a 4K×16 bit memory circuit 30*a*–*d*) is fabricated onto the die 10 for each of the memory circuits 30*a*–*d*. Each counter 40*a*–*d* acts as an address generator to constantly access and exercise cells within the memory circuits 30*a*–*d* as environmental stresses are applied to the test device 60. In an alternate embodiment employing 8K×22 bit memory circuits 30*a*–*d* as previously described, the counters 40*a*–*d* are 16 bit counters.

As a quality control measure for fabrication of integrated circuitry on the die 10, process monitors 50*a*–*d* (optional) may be fabricated onto the die 10 to measure the strength of the fabrication process. For example, if photoresist masks are slightly skewed during the fabrication of memory circuit transistors, then the performance of the transistors will be diminished or at worst, nonfunctional. Each process monitor 50*a*–*d* measures the strength of the fabrication process to ensure that each element of the circuit 30*a*–*d* was adequately formed on the die 10. If a process monitor 50*a*–*d* indicates a weak or poor fabrication process, then the suspect die 10 will not be used for qualification testing. In this manner, test dice 10 are screened for fabrication defects prior to testing.

A complete description of process monitor operation can be found in U.S. Pat. No. 5,068,547 to Gascoyne, the entire disclosure of which is expressly incorporated herein by reference.

It is contemplated, and will be apparent to those skilled in the art from the foregoing specification, drawings, and examples that modifications and/or changes may be made in the embodiments of the invention. Accordingly, it is expressly intended that the foregoing are illustrative of preferred embodiments only, not limiting thereto, and that the true spirit and scope of the present invention be determined by reference to the appended claims.

What is claimed is:

1. A circuit die for use in an environmental test chamber and with a tester, for experiencing a failure when exposed to electrical and environmental stresses, and thereby testing a circuit package's ability to withstand electrical and environmental stresses, the circuit die comprising:

a substrate having a periphery and corners;

bonding sites positioned at the periphery of the substrate;

substantially identical circuits, one or more of the circuits for functionally failing during testing in response to the electrical and environmental stresses and design flaws in the circuit package, the functional failure being detectable by the tester, the substantially identical circuits positioned adjacent the corners of the substrate where higher stresses are expected;

the remainder of the substrate between the substantially identical circuits being free of circuitry, and means for electrically connecting the substantially identical circuits to different bonding sites at the periphery of the substrate.

2. The die of claim 1, wherein the substantially identical circuits further comprise memory circuits.

3. The die of claim 1, wherein the substantially identical circuits further comprise read only memory circuits.

4. The die of claim 2, wherein the substantially identical circuits further comprise counters, a different one of the counters electrically connected to each of the substantially identical circuits.

5. The die of claim 2, wherein the substantially identical circuits further comprise process monitors, a different one of the process monitors electrically connected to each of the substantially identical circuits.

6. A test device for use in an environmental test chamber and with a tester, for experiencing a failure when exposed to electrical and environmental stresses, and thereby testing a structural support member's ability to withstand the electrical and environmental stresses, the test device comprising:

the structural support member for packaging a circuit die;

the circuit die structurally attached and electrically connected to the structural support member, the circuit die comprising:

a substrate having a periphery and corners;

bonding sites positioned at the periphery of the substrate;

substantially identical circuits, one or more of the circuits for functionally failing during testing in response to the electrical and environmental stresses and design flaws in the structural support member, the functional failure being detectable by the tester, the substantially identical circuits positioned adjacent the corners of the substrate where higher stresses are expected;

the remainder of the substrate between the substantially identical circuits being free of circuitry; and means for electrically connecting the substantially identical circuits to different bonding sites at the periphery of the substrate; and means for electrically connecting the bonding sites to the structural support member.

7. The device of claim 6, wherein the substantially identical circuits further comprise memory circuits.

8. The device of claim 6, wherein the substantially identical circuits further comprise read only memory circuits.

* * * * *